United States Patent [19]

Miwa et al.

[11] Patent Number: 5,641,692

[45] Date of Patent: Jun. 24, 1997

[54] METHOD FOR PRODUCING A BI-MOS DEVICE

[75] Inventors: Hiroyuki Miwa; Hiroaki Anmo, both of Kanagawa, Japan

[73] Assignee: Sony Corporation, Tokyo, Japan

[21] Appl. No.: 574,363

[22] Filed: Dec. 18, 1995

[30]    Foreign Application Priority Data

Dec. 19, 1994 [JP] Japan .................... 6-335015

[51] Int. Cl.$^6$ ................................. H01L 21/265
[52] U.S. Cl. .................... 438/236; 148/DIG. 9; 257/370; 438/329; 438/204
[58] Field of Search ............... 437/59, 60, 186, 437/31; 148/DIG. 9; 215/370

[56]                 References Cited

U.S. PATENT DOCUMENTS

| 3,725,145 | 4/1973 | Maki | 437/59 |
|---|---|---|---|
| 3,767,487 | 10/1973 | Steinmaier | 437/59 |
| 4,072,975 | 2/1978 | Ishitani | 437/59 |
| 4,325,180 | 4/1982 | Curran | 437/59 |
| 4,409,725 | 10/1983 | Hotta et al. | 437/59 |
| 4,616,405 | 10/1986 | Yasuoka | 437/59 |
| 4,721,686 | 1/1988 | Contiero et al. | 437/59 |
| 5,108,944 | 4/1992 | Shirai et al. | 437/59 |
| 5,141,881 | 8/1992 | Takeda et al. | 437/59 |
| 5,288,651 | 2/1994 | Nakazawa | 437/31 |
| 5,288,652 | 2/1994 | Wang et al. | 437/31 |
| 5,304,501 | 4/1994 | Tong | 437/31 |
| 5,409,843 | 4/1995 | Yamauchi et al. | 437/31 |
| 5,416,039 | 5/1995 | Yilmaz et al. | 437/59 |

FOREIGN PATENT DOCUMENTS

| 0036561 | 2/1990 | Japan | 437/59 |
|---|---|---|---|

*Primary Examiner*—John Niebling
*Assistant Examiner*—Long Pham
*Attorney, Agent, or Firm*—Hill, Steadman & Simpson

[57]               ABSTRACT

A method for producing a semiconductor device which decrease the number of processes at the time of producing BiCMOSLSI than the usual. Impurities are introduced into a semiconductor substrate under a second insulating film and a first electric conductive film utilizing a first insulating film and the first conductive film formed on the semiconductor substrate as masks. Therefore, it is able to perform concurrent introduction of impurities into the gate electrode, the source and the drain of the MOSFET, the base electrode of the bipolar transistor, the emitter and the collector contact of the lateral bipolar transistor, the outlet electrode of the capacitor, and the resistor, so that the number of process steps can be reduced.

10 Claims, 4 Drawing Sheets

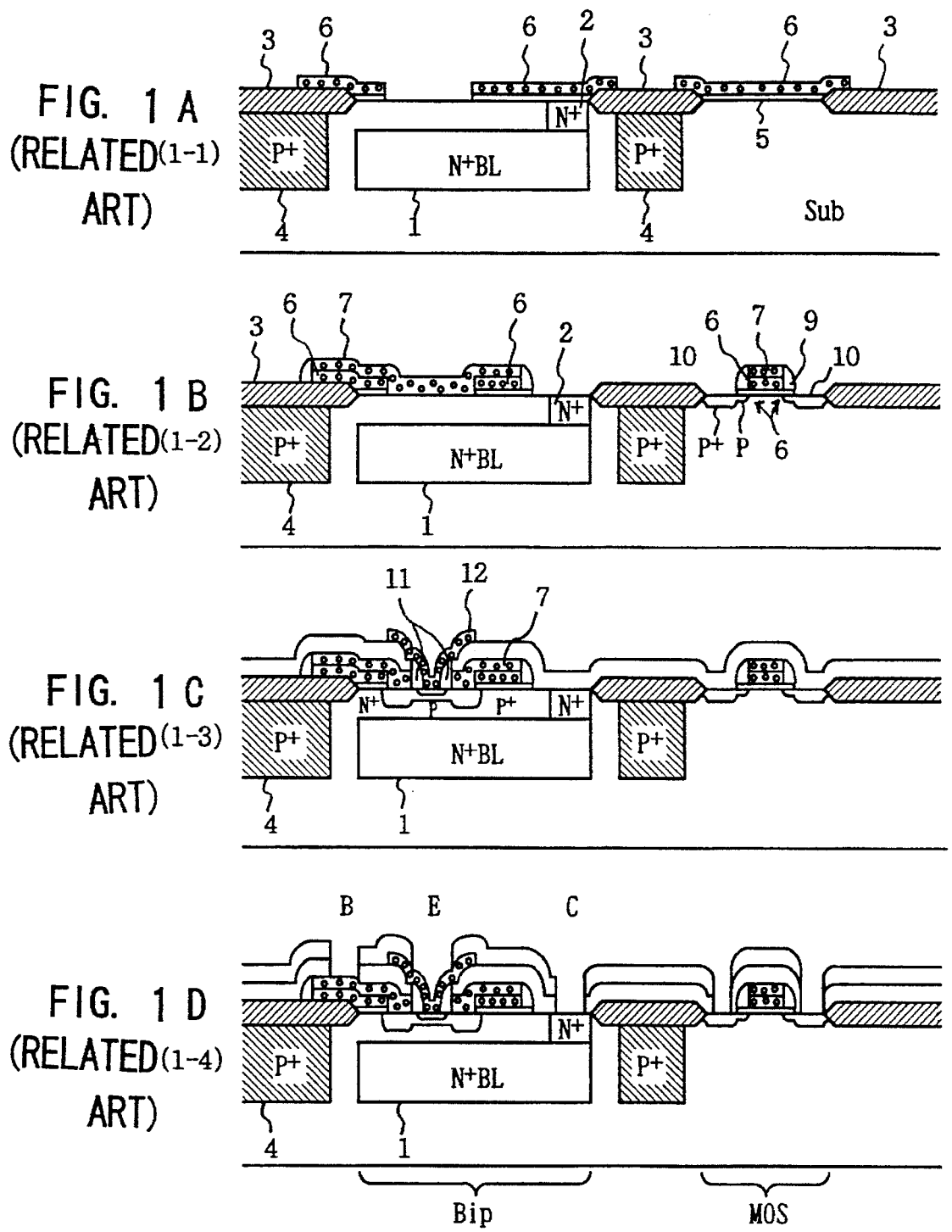

(2-1)

(2-2)

(2-3)

(2-4)

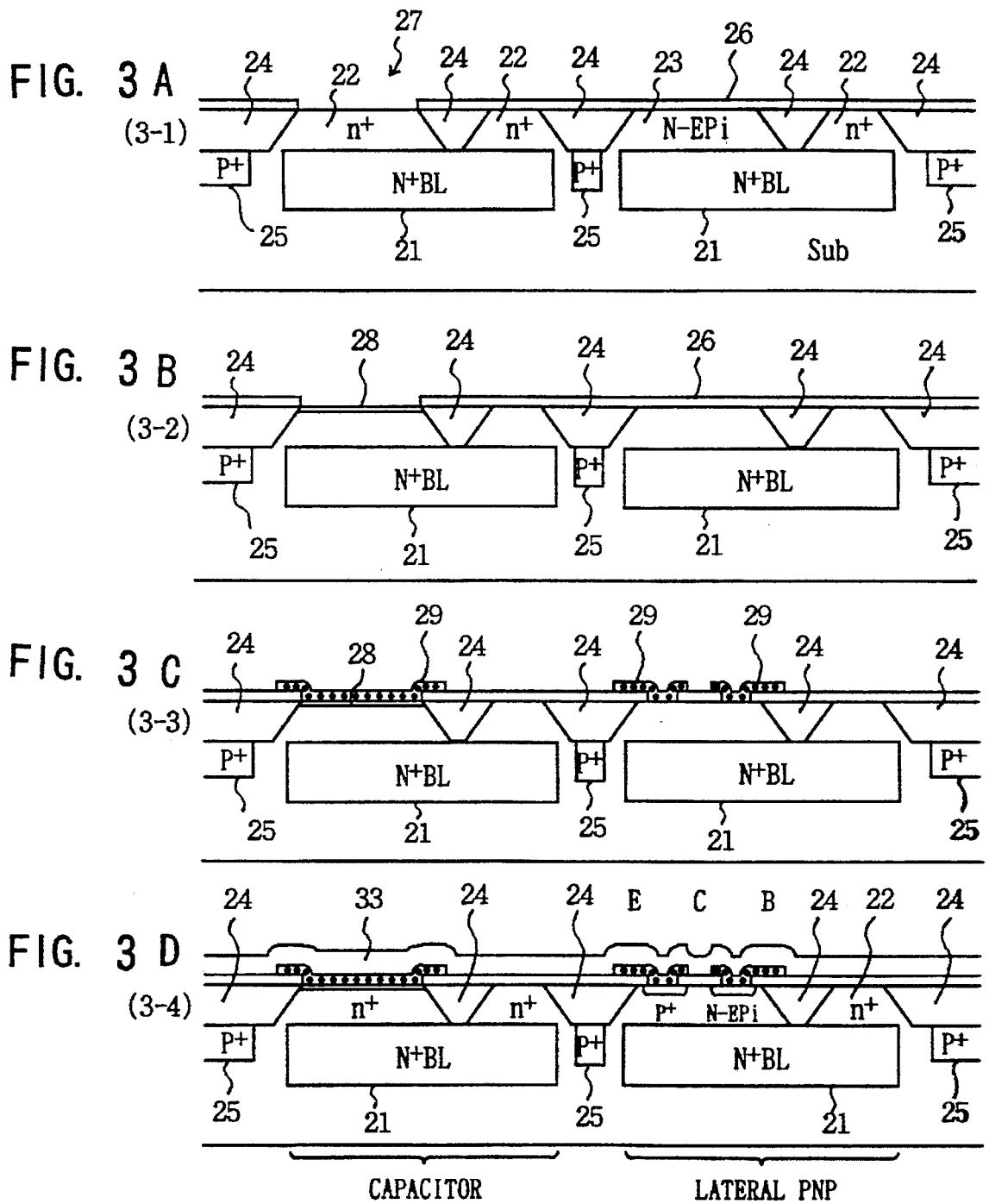

FIG. 4A (4-1)
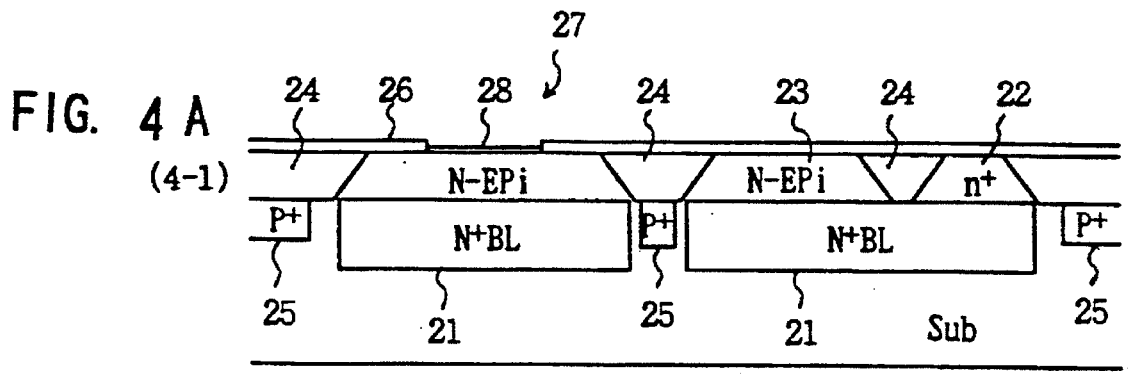
FIG. 4B (4-2)
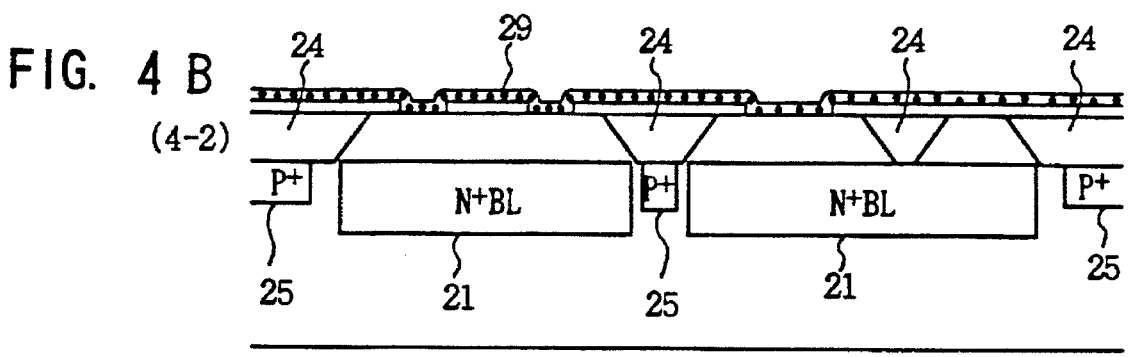
FIG. 4C (4-3)
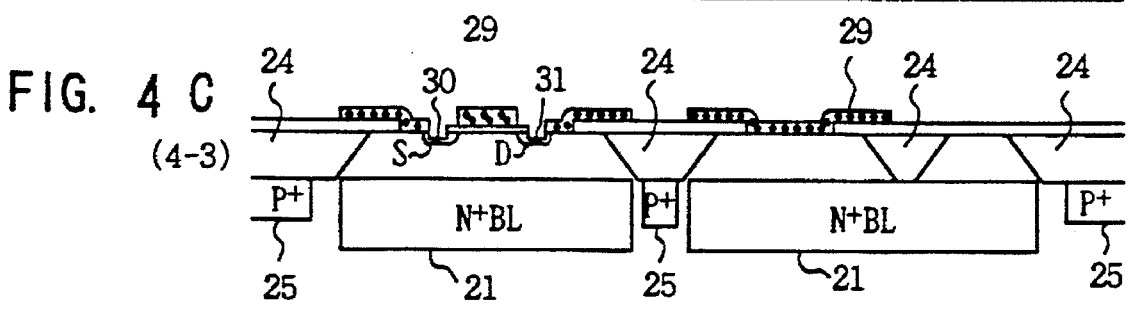
FIG. 4D (4-4)
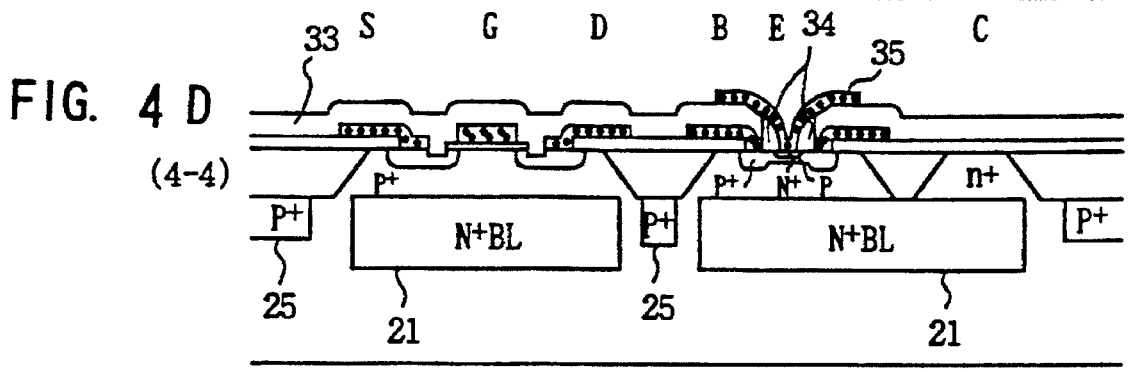

METHOD FOR PRODUCING A BI-MOS DEVICE

BACKGROUND OF THE INVENTION

1. Field of the Invention

The present invention relates to a method for producing a semiconductor device, which is especially suitable to a method for producing a semiconductor device containing a bipolar transistor and a MOSFET of high-performance.

2. Description of the Related Art

Today, it is advancing to become electronic apparatuses smaller and lightweight with high-performance and multi-functions. By this reason, a bipolar-MOS hybrid LSI (hereinafter, referred to as a BiMOSLSI) is remarked which combining merits of high speed and high precision of a bipolar transistor and high integration and low power consumption of a MOSFET.

However, in the case of the conventional BiMOSLSI manufacturing process, there have been problems where the number of process steps increases as the respective performances of the bipolar transistor and the MOSFET become higher, and the cost of wafer process and TAT (turn around time) increase. Thus, uses of the products to which this producing method can be applied have been limited.

A conventional BiMOSLSI producing process is shown in FIGS. 1A to 1D, which show a sectional view of an upper portion of a silicon substrate of a bipolar transistor part and a P-channel MOS transistor part of double-polysilicon structure. The process flow is as follows.

(1-1) Process

At first, an $N^+$ buried layer 1 and a diffusion layer 2 are formed in a bipolar-transistor part of a semiconductor substrate Sub. After production, the $N^+$ buried layer 1 and the diffusion layer 2 function as a collector outlet of a NPN transistor.

Next, a LOCOS oxide film 3 and a $P_+$ diffusion layer 4 for element isolation are formed, and then a gate oxide film 5 is formed. At this time, the LOCOS oxide film 3 is formed to have the thickness of 200 to 400 [nm], and the gate oxide film 5 is formed to have the thickness 10 to 20 [nm].

After that, a polysilicon film 6 having the thickness of about 100 to 200 [nm] is formed all over the surface by chemical vapor deposition (hereunder, referred to as CVD), and the polysilicon/gate-oxide laminated film of the base and emitter forming portion of the bipolar transistor part is then opened with the existing dry etching technique.

The polysilicon film 6 functions as a protective film for the gate oxide film 5. That is, it can be prevented that a deficiency of resisting pressure, etc. occurs due to a contamination of the gate oxide film in a resist exfoliation process at the time when the gate oxide film 5 is opened.

Further, the (1-2) process can prevent from a gate-oxide-film etching at the time of light etching by HF (hydrogen fluoride) before forming a second polysilicon film 7. The light etching remove a natural oxide film of an interface of the polysilicon-silicon substrate so as to decrease a contact resistance with the substrate. This is needed to utilize the polysilicon as an outlet electrode which is based on a contact with the substrate. The process of protecting a gate oxide film with a polysilicon is needed as the gate oxide film comes thinner to about 20 [nm] or less.

(1-2) Process

Next, the second polysilicon film 7 having the thickness of 100 to 200 [nm] is formed by CVD. Combination with the former polysilicon CVD makes the thickness of the polysilicon film amounts to 300 to 400 [nm].

Then, $N^+$ ions are implanted into the gate-electrode portion of the MOS, and $P^+$ ions are implanted into the base-electrode forming portion of the bipolar transistor part. After that, leaving the gate-electrode of the MOS and the base-electrode of the bipolar transistor part, the first and the second polysilicon films are processed by the existing dry etching technique. In this connection, $N^+$ ions are implanted into the gate-electrode portion of the MOS in order to improve the characteristic of a N-channel MOS to be formed usually on the same substrate to have a surface-channel structure.

Next, $P^{31}$ ions are implanted into the MOS part, and an LDD (lightly doped drain) diffusion layer 8 is formed. It is necessary to form the LDD diffusion layer 8 for the purpose of improving the hot-carrier resistance, as the gate length become more minute, that is, sub-micron to sub-half-micron.

Then, $SiO_2$ having the thickness of 200 to 400 [nm] is formed by CVD, and an $SiO_2$ spacer 9 for LDD is formed by anisotropic etching with the existing dry etching technique.

The region for forming the base and the emitter of the bipolar transistor is covered with polysilicon, so that it can be protected and not exposed to overetching at the time of forming the $SiO_2$ spacer 9 for LDD by the anisotropic etching. Consequently, such problems as degradation of elements and deterioration of yield due to an RIE (reactive ion etching) damage do not occur. Then, $P^+$ ions are implanted into the MOS part, and source and drain diffusion layers 10 are formed.

(1-3) Process

After an $SiO_2$ film having the thickness of 300 to 400 [nm] is formed by CVD, an $SiO_2$/polysilicon laminated film of the region for forming the base and the emitter of the bipolar transistor is etched and removed by the use of existing dry etching technique.

Then, an $SiO_2$ film having the thickness of 400 to 600 [nm] is formed by CVD, and an $SiO_2$ spacer 11 for separating the emitter and the base electrode is formed by the anisotropic etching with the existing dry etching technique.

Next, a polysilicon 12 for forming an emitter is formed by CVD and then processed by the use of existing dry etching technique. Then, ions are implanted into the polysilicon 12 and diffused, so that a base and an emitter are formed.

The heat treatment of this time makes $P^+$ diffusion from the base outlet electrode 7 so as to form a graft base, and, at the same time, the source and drain diffusion layer of the MOS part is activated.

(1-4) Process

The $SiO_2$ film having the thickness of 300 to 400 [nm] is formed by CVD, and then respective electrodes are formed by the use of the existing wiring technique (not shown).

As is evident from a series of above procedures, there is a problem that added process steps are increased in accordance with forming of MOSFET and its elaboration and sophistication. To put it concretely, it is needed to perform CVD on a polysilicon film as a protecting film for a gate oxide film, and also it is needed to implant $N^+$ ions into a gate-electrode portion of MOS.

Besides, it is needed to form the LDD diffusion layer and a source/drain diffusion layer. This causes increase of the number of process steps, and such a possibility as increasing of the processing cost and the TAT has been not avoidable.

SUMMARY OF THE INVENTION

In view of the foregoing, an object of the present invention is to provide a method for producing a semiconductor device which is able to add a MOSFET, by adding minimum steps needed, on the basis of a high-performance bipolar transistor.

The foregoing object and other objects of the invention have been achieved by the provision of a method for producing semiconductor device, comprising: a process for forming a first opening in a first insulating film formed on a semiconductor substrate; a process for forming a second insulating film on at least a part of the semiconductor substrate exposed in the first opening; a process for forming a second opening in the first insulating film; a process for forming a first electric conductive film on a part of the second insulating film and the second opening; and a process for introducing impurities into at least a partial region of the semiconductor substrate laid under the second insulating film and the first electric conductive film, utilizing the first insulating film and the first electric conductive film as a mask.

In the present invention, impurities are introduced into the semiconductor substrate laid under the second insulating film and into the first electric conductive film, utilizing the first insulating film and the first electric conductive film, which are formed on the semiconductor substrate, as the mask. Thus, impurities can be concurrently introduced into the gate electrode, the source and the drain of the MOSFET, the base electrode of the bipolar transistor, the emitter and collector contact of the lateral bipolar transistor, the outlet electrode of the capacitor, and the resister.

At this time, the first insulating film and the first electric conductive film are being utilized as the mask, so that impurities are not introduced into the surface area of the semiconductor substrate of the lateral bipolar transistor, and into the dielectric film of the capacitor, by which a bad influence upon their properties can be prevented.

Further, the second insulating film can be utilized as the gate oxide film of the MOSFET and/or the dielectric film of the capacitor so as to decrease the number of process steps.

Further, it is able to form the base contact (graft base) region in the semiconductor substrate, utilizing the base electrode of the bipolar transistor as the source of impurity-diffusion; besides, it is able to form the emitter region and the collector region in the semiconductor substrate, utilizing the emitter, collector electrode forms of the lateral bipolar transistor as the source of impurity-diffusion.

Further, it is able to form the emitter in a self-aligned manner with respect to the base electrode of the bipolar transistor.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 1A to 1D are schematic cross sectional views explaining a conventional method for producing a semiconductor device;

FIGS. 3A to 3D are schematic cross sectional views explaining a method for producing a semiconductor device according to the present invention; and FIGS. 4A to 4D are schematic cross sectional views explaining a method for producing a semiconductor device according to the present invention.

DETAILED DESCRIPTION OF THE EMBODIMENT

Preferred embodiments of the present invention will be described with reference to the accompanying drawings:
(1) Summary The principle of the method for producing the semiconductor device which will be described in the following terms is to collectively introduce impurities utilizing an oxide film and a polysilicon electrode as a mask. Thereby, the gate electrode, the source and the drain electrode of the MOSFET, the base electrode of the bipolar transistor, the emitter and the collector electrode of the lateral bipolar transistor, the outlet electrode of the capacitor, the resister and others are produced with lesser steps (that is, lower cost). The concrete examples of production are as follows.
(2) The First Embodiment In this embodiment, an example will be described of the case where the P-channel MOS transistor, the double polysilicon NPN bipolar transistor, the capacitor, and the lateral PNP bipolar transistor are formed on the same substrate.

Figure 2A:
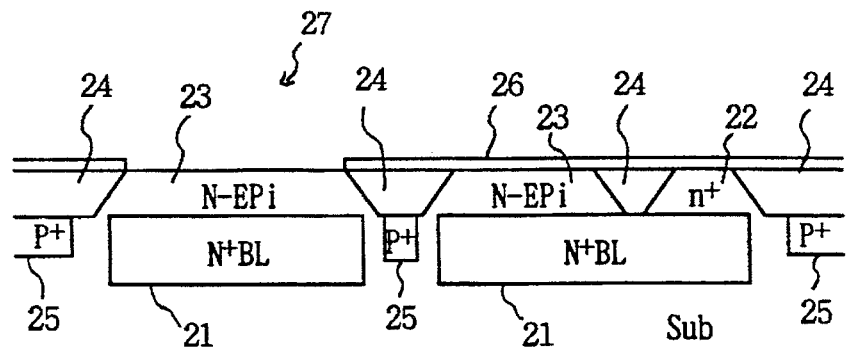
FIGS. 2A to 2D are schematic cross sectional views explaining a method for producing a semiconductor device according to the present invention.
Figure 2B:
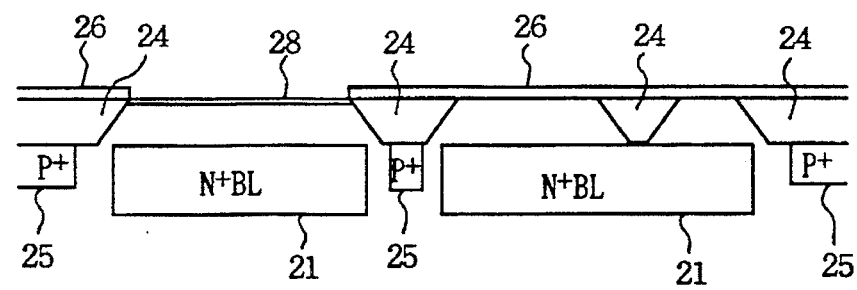
Figure 2C:
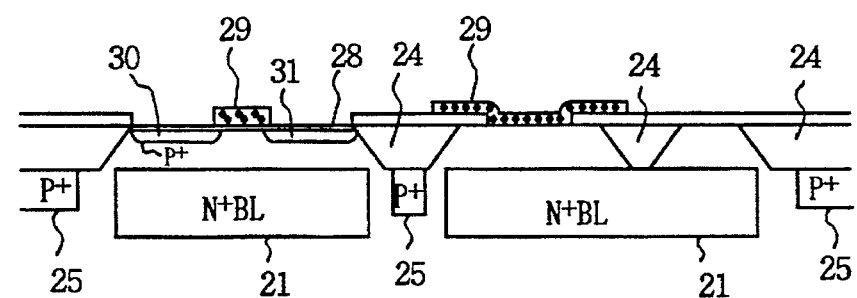
Figure 2D:
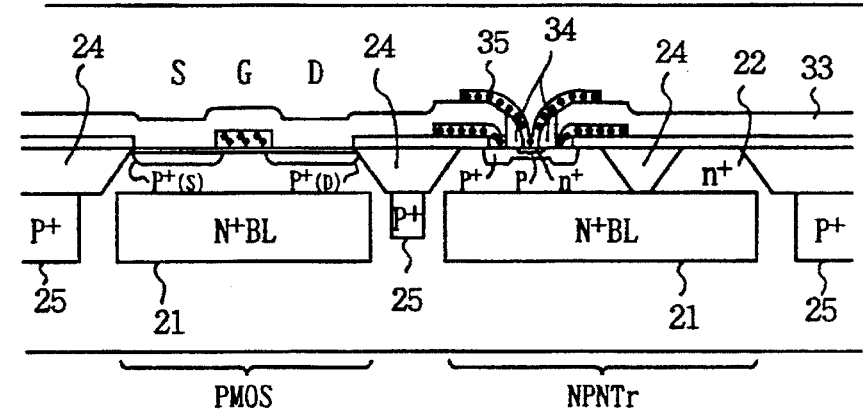

FIGS. 2A to 2D are sectional views of an upper portion of a silicon substrate, and showing the region in which the P-channel MOS transistor and the NPN bipolar transistor having a double-polysilicon structure are formed.

FIGS. 3A to 3D are sectional views of an upper portion of the silicon substrate, and showing the region in which the capacitor and the lateral PNP bipolar transistor are formed.

The process flow will be described hereunder. In this connection, each step (2-1) to (2-4) of FIGS. 2A to 2D and each step (3-1) to (3-4) of FIGS. 3A to 3D are corresponding to the cross sectional views of the respective elements of the same point of time.
(2-1) and (3-1) Processes At first, an $N^+$ buried layer 21, a diffusion layer 22, and a N-type epitaxial layer 23 are formed on a P-type substrate Sub, which function as the well region of the PMOS, the collector outlet of the NPN transistor, the lower electrode of the capacitor, and the base outlet of the lateral PNP transistor.

Next, a LOCOS oxide film 24 and a $P^+$ diffusion layer 25 are formed for separation of elements, and then the first oxide film 26 is formed. Here, the LOCOS oxide film 24 is formed into 500 to 1000 [nm] thick, and the first oxide film 26 is formed into 100 to 200 [nm] thick. CVD may be utilized for the first oxide film.

The oxide film 26 of a part of a region in which the MOSFET and the capacitor are formed is then removed, so that a first opening 27 is formed.
(2-2) and (3-2) Processes In the first opening 27, a second oxide film 28 is formed. The oxide film 28 functions as a MOS gate oxide film and a capacitor dielectric film.

In a BiMOSLSI for common use, an excessive performance of the MOSFET is not required, therefore the second oxide film 28 may have a thickness of about 20 to 50 [nm]. Consequently, when a polysilicon film is formed next time, it is not needed to regard an influence exercised from light etching.
(2-3) and (3-3) Processes Subsequently, portions of the first insulating film 26 lying in the region in which the emitter and the base of the NPN transistor are to be formed and the region in which the emitter/collector of the lateral PNP transistor are to be formed are then removed, so that openings are formed.

Then, a polysilicon film of about 100 to 200 [nm] thick is formed all over the surface by CVD, as a first conductive film 29. Then, the polysilicon film is so processed as to leave the gate electrode of the MOS, the base electrode of the NPN transistor, the upper electrode of the capacitor, and the emitter electrode and the collector electrode of the lateral PNP transistor in their places, using the existing dry etching technique.

P$^+$ ions are then implanted, so that impurities are concurrently introduced into the gate electrode, the source 30 and the drain 31 of the MOSFET, and the base electrode 32 of the bipolar transistor.

At the time of the ion implantation, P$^+$ ions are implanted utilizing the first insulating film 26 and the first electric conductive film 29 as the mask, therefore impurities are not introduced into the semiconductor substrate surface region of the lateral PNP transistor and into the dielectric film of the capacitor. Consequently, such bad influences upon their characteristics are prevented as $h_{FE}$ fluctuation due to $Q_b$ fluctuation of the PNP transistor and increasing of leakage current due to damage introduction into the dielectric film of the capacitor.

As to a condition of ion implantation of this time, for instance, BF$_2^+$ ions may be implanted to the extent of 1 to 5×10$^{15}$ [cm$^{-2}$] with energy of about 30 to 50 [keV].

Besides, LDD diffusion layer does not have to be formed, unless a gate length of the MOSFET is minimized to sub-micron/sub-half-micron.

A part of a P$^+$ polysilicon body can be utilized as a resistor.

(2-4) and (3-4) Processes

The SiO$_2$ film 33 having the thickness of 300 to 400 [nm] is formed by CVD, and then the existing dry etching technique removes the base portion of NPN and the laminated film of the region for forming of the emitter composed of the SiO$_2$ film 33 and the polysilicon film 29.

Then, the SiO$_2$ film having the thickness of 400 to 600 [nm] is formed by CVD, and performed anisotropic etching by the existing dry etching technique, so that a SiO$_2$ spacer 34 for separating the emitter and the base electrode is formed.

Next, a polysilicon film 35 for forming an emitter is formed by CVD, and processed to become the shape of the electrode by the use of existing dry etching technique. Ions are implanted into thus processed polysilicon film 35 and then thermal diffusion is produced, so that the base and the emitter are formed.

The heat treatment of this time diffuses P$^+$ from the base-outlet electrode of the NPN transistor and forms the graft base of the NPN transistor. At the same time, P$^+$ are diffused from the emitter electrode and the collector electrode of the PNP transistor so as to form the emitter and the collector of the PNP transistor. Further, the source and drain diffusion layer of the MOS part is activated simultaneous.

After above processes, the SiO$_2$ film having the thickness of 300 to 400 [nm] is formed by CVD, and then each electrode is formed by the use of the existing wiring technique (not shown).

By the above-mentioned series of processes, it is able to produce the semiconductor device which includes the P-channel MOS transistor, the double polysilicon NPN transistor, the lateral PNP transistor, the capacitor, etc., on the same substrate.

Incidentally, it has been found that the following points can be improved by the use of above manufacturing procedures.

It becomes possible to concurrently perform introduction of impurities into the gate electrode, the source and the drain of the MOSFET, introduction of impurities into the base electrode of the bipolar transistor, introduction of impurities into the emitter electrode and the collector electrode of the lateral bipolar transistor, introduction of impurities into the outlet electrode of the capacitor, introduction of impurities into the resistor, etc.

In addition, impurities are not introduced, at this time, into the semiconductor substrate surface region of the lateral bipolar transistor and into the dielectric film of the capacitor, so that it can be prevented from bad influences upon them.

Moreover, since the step for producing the gate oxide film of the MOSFET can be utilized as the step for producing the dielectric film of the capacitor, the number of producing processes can be reduced.

Besides, it is possible to form the base contact region (graft base region) in the semiconductor substrate, utilizing the base electrode of the bipolar transistor as the source of impurity diffusion. Similarly, it is also possible to form the emitter region and the collector region in the semiconductor substrate, utilizing the emitter electrode and the collector electrode of the lateral bipolar transistor as the source of impurity diffusion.

Besides, it is able to form the emitter in a self-aligned manner with respect to the base electrode of the bipolar transistor.

It is able to realize a producing method which can add a MOSFET by only adding minimum processes needed on the basis of a bipolar transistor with higher performance than that of these.

(3) The Second Embodiment

FIGS. 4A to 4D show cross sectional views of an upper portion of a silicon substrate where a P-channel MOS transistor and a NPN bipolar transistor of double polysilicon structure are to be formed in. The process flow is shown hereunder.

(4-1) Process

In this connection, (4-1) process is corresponding to processes of (2-1) and (3-1), and processes of (2-2) and (3-2) of the preceding term.

The N$^+$ buried layer 21, the diffusion layer 22, and the N$^{31}$ epitaxial layer 23 are formed on a P-type substrate Sub.

These function as the well of the PMOS, the collector outlet of the NPN transistor, the lower electrode of the capacitor, and the base outlet of the lateral PNP transistor.

Next, the LOCOS oxide film 24 and the P$^+$ diffusion layer 25 for separation of elements are formed, and then the first oxide film 26 is formed.

The LOCOS oxide film 24 is formed into the thickness of 500 to 1000 [nm], and the first oxide film 26 is formed into the thickness of 100 to 200 [nm]. At this time, CVD may be used for forming of the first oxide film.

Next, the first oxide film 26 in a region for forming the MOSFET and the capacitor is removed, so that the first opening 27 is formed.

After that, the second oxide film 28 is formed in the first opening 27. The oxide film 28 functions as an MOS gate oxide film and a capacitor dielectric film.

In a BiMOSLSI for common use, since an excessive performance of the MOSFET is not required, the thickness of the second oxide film 28 may be 20 to 50 [nm]. Consequently, when a polysilicon film is formed next time, it does not need to regard an influence due to light etching.

(4-2) Process

The (4-2) process and the next (4-3) process correspond to processes of (2-3) and (3-3) of the preceding term.

In this process, the first insulating film 26 of the region for forming the source, drain contact of the PMOS transistor, the first insulating film 26 of the region for forming the emitter and the base of the NPN transistor, and the first insulating film 26 of the region for forming the emitter and the collector of the lateral PNP transistor are removed and opened.

Next, a polysilicon film having the thickness of about 100 to 200 [nm] is deposited all over the surface by CVD, as the first electric conductive film 29.

(4-3) Process

Then, the polysilicon film is so processed as to leave the gate electrode and a source and drain outlet electrode of the MOS, the base electrode of the NPN transistor, the upper electrode of the capacitor, and the emitter and the collector electrodes of the lateral PNP transistor in their places, by the existing dry etching technique.

$P^+$ ions are then implanted, so that impurities are concurrently introduced into the gate electrode, the source, the drain, the source and drain outlet electrode of the MOSFET, and the base electrode of the bipolar transistor.

At this time, the first insulating film 26 and the first electric conductive film 29 are utilized as the masks, therefore the impurities are not introduced into the semiconductor substrate surface region of the lateral PNP transistor and the dielectric film of the capacitor. Consequently, such bad influences upon their characteristics are prevented as fluctuation of $h_{FE}$ due to $Q_b$ fluctuation of the PNP transistor and increasing of leakage current due to damage introduction into the dielectric film of the capacitor.

As to a condition of ion implantation of this time, for instance BF2 ions may be implanted to the extent of 1 to $5 \times 10^{15}$ [cm$^{-2}$] with energy of about 30 to 50 [keV].

Besides, LDD diffusion layer does not have to be formed unless a gate length of the MOSFET is minimized to sub-micron/sub-half-micron.

A part of a $P^+$ polysilicon body may be utilized as a resistor.

(4-4) Process (4-4) process is corresponding to processes of (2-4) and (3-4).

At first, the SiO$_2$ film 33 having the thickness of 300 to 400 [nm] is formed by CVD, and then the oxide-film/polysilicon laminated film of the region for forming the base and the emitter of the NPN transistor is removed by the use of existing dry etching technique.

Thereafter, the SiO$_2$ film having the thickness of 400 to 600 [nm] is formed by CVD and anisotropic etching is performed by the existing dry etching technique, so that the oxide film spacer 34 for separating the emitter and the base electrode is formed.

Next, a polysilicon film for forming an emitter is formed by CVD, and is processed by the existing dry etching technique.

Subsequently, the base and the emitter are formed by ion implantation and diffusion to the polysilicon film.

The heat treatment of this time diffuses $P^+$ from the base-outlet electrode of the NPN transistor and the emitter, collector electrodes of the lateral PNP transistor to form the graft base of the NPN transistor and the emitter and the collector of the PNP transistor, and the source and drain diffusion layer of the MOS is activated at the same time.

After the SiO$_2$ film having the thickness of 300 to 400 [nm] has been formed by CVD, each electrode is formed by the use of the existing wiring technique (not shown).

When the above-mentioned processes are used, the same effects as that of the first embodiment can be obtained. In addition, the outlet electrode can be formed in a self-aligned manner with respect to the source and drain diffusion layer of the MOSFET, so that it is able to contribute to decreasing of areas of elements and increasing of degree of integration.

(4) Other Embodiments

In the above-mentioned embodiments, the P-channel MOS transistor, double polysilicon NPN bipolar transistor, the capacitor, and the lateral PNP bipolar transistor are formed on the identical substrate. However, the present invention is not only limited to this, but also applicable to the case where some of those are formed on the identical substrate.

As described above, according to the present invention, it becomes possible to perform concurrent introduction of impurities into the gate electrode, the source and the drain of the MOSFET, the base electrode of the bipolar transistor, the emitter and the collector electrode of the lateral bipolar transistor, the outlet electrode of the capacitor, and the resistor. In addition, impurities are not introduced at this time into the semiconductor substrate surface region of the lateral bipolar transistor and the dielectric film of the capacitor, so that bad influences upon these can be prevented.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A method for producing a semiconductor device for forming a bipolar transistor and MOSFET on a semiconductor substrate, comprising the steps of:

forming a first opening in a first insulating film formed on said semiconductor substrate;

forming a second insulating film on at least a part of said semiconductor substrate exposed in said first opening;

forming a second opening in said first insulating film;

subsequently forming a first electric conducting film on a part of said second insulating film and said second opening; and thereafter introducing impurities into at least a partial region of the semiconductor substrate located under said second insulating film and the first electric conductive film, utilizing said first insulating film and said first electric conductive film as masks.

2. The method for producing a semiconductor device according to claim 1, wherein:

the impurities introduced into at least said partial region of the semiconductor substrate are a first conductive type; and further comprising a step of diffusing impurities of said first conductivity type from the first conductive film to form a diffusion layer on the semiconductor substrate.

3. The method for producing a semiconductor device according to claim 2, comprising the steps of:

forming a third opening in a part of said first electric conductive film on the semiconductor substrate exposed in said second opening; and introducing impurities of a second conductive type into said third opening.

4. The method for producing a semiconductor device according to claim 1, wherein a thickness of said second insulating film is equal to or less than that of said first insulating film.

5. The method for producing a semiconductor device according to claim 1, wherein said first insulating film is formed on a surface of a lateral bipolar transistor.

6. The method for producing a semiconductor device according to claim 1, wherein
said first electric conductive film is formed on a surface of a dielectric film of a capacitor.

7. The method for producing a semiconductor device according to claim 1, wherein said second insulating film is a gate oxide film of a MOSFET and/or a dielectric film of a capacitor.

8. The method for producing a semiconductor device according to claim 1, wherein said first electric conductive film through further processing forms a source, a drain of a MOSFET, and/or a base contact of bipolar transistor, and/or and emitter, a collector of a lateral bipolar transistor.

9. The method for producing a semiconductor device according to claim 1, wherein a diffusion layer for said first conductive type of impurities through further processing forms a source, a drain of a MOSFET, and/or a base contact of a bipolar transistor, and/or a emitter, a collector of a lateral bipolar transistor.

10. The method for producing a semiconductor device according to claim 3, wherein a diffusion layer for said second conductive type of impurities through further processing forms an emitter of a bipolar transistor.

* * * * *